United States Patent [19]

Ohta et al.

[11] Patent Number: 5,117,329
[45] Date of Patent: May 26, 1992

[54] MOUNTING STRUCTURE FOR FLEXIBLE PRINTED WIRING BOARD HAVING HOLDING RIBS AND AUXILIARY RIBS PROTRUDING THEREBETWEEN

[75] Inventors: Noriaki Ohta; Kenichi Hashimoto, both of Shimada, Japan

[73] Assignee: Yazaki Corporation, Tokyo, Japan

[21] Appl. No.: 612,670

[22] Filed: Nov. 14, 1990

[30] Foreign Application Priority Data

Nov. 15, 1989 [JP] Japan ................. 1-132040[U]

[51] Int. Cl.⁵ ..................... H05K 7/02; A44B 21/00
[52] U.S. Cl. ................................ 361/395; 361/398; 24/571
[58] Field of Search ............... 24/570, 571; 361/395, 361/398, 399; 174/254, 255

[56] References Cited

U.S. PATENT DOCUMENTS 3,206,851  9/1965  Smith ..................... 24/571 X

FOREIGN PATENT DOCUMENTS 64213  10/1913  Switzerland ................. 24/571

*Primary Examiner*—Leo P. Picard
*Assistant Examiner*—Michael W. Phillips
*Attorney, Agent, or Firm*—Venable, Baetjer and Howard

[57] ABSTRACT

A mounting structure for a flexible printed wiring board arranged such that the portion of the printed wiring board protruding from the rear surface of a casing such as, for example, an instrument casing is bent along the side wall of the instrument casing and the bent portion is restrained and fixedly secured by a plurality of holding ribs formed on the instrument casing. Further, auxiliary ribs with rounded leading ends are disposed in such a manner that each of the auxiliary ribs is formed between the adjoining holding ribs so as to allow the auxiliary ribs to partially overlap the holding ribs in the direction of wall thickness thereof.

3 Claims, 2 Drawing Sheets

MOUNTING STRUCTURE FOR FLEXIBLE PRINTED WIRING BOARD HAVING HOLDING RIBS AND AUXILIARY RIBS PROTRUDING THEREBETWEEN

BACKGROUND OF THE INVENTION

1. Field of the Invention

This invention relates to an improvement in mounting structure for flexible printed wiring boards, and more particularly to a mounting structure for a flexible printed wiring board, which is arranged to enable the portion of the printed wiring board protruding from the rear surface of a casing such as, for example, an instrument casing to be fixedly secured.

2. Description of the Prior Art

The mechanism of instruments for motorcars has become complicated increasingly of late, and such equipment has become deluxe in general, so that electrical circuits thereof have become extremely intricate.

Therefore, wirings leading to instruments for motorcars are made generally using printed wiring boards. In particular, flexible printed wiring boards are commonly used, because they can be mounted relatively easily on the rear surfaces of casings such as instrument casings even if such rear surfaces are uneven in configuration, and also because they are lighter in weight than printed wiring boards of the rigid type and have excellent characteristics in terms of energy saving.

Such flexible printed wiring boards are, however, disadvantageous in that, since copper foils forming the electrical circuits thereof are arranged in a plurality of rows and occupy considerable width or space, in case casings such as instrument casings are manufactured with the minimum allowable dimensions, a portion of such a printed wiring board protrudes sidewise from the rear surface of the instrument casing and tends to contact other component part(s), thus causing a risk of damage of the component part(s) by the protruding portion and disconnection of the wirings.

As a prior art arrangement for solving the above-mentioned problem, there are heretofore known mounting structures for flexible printed wiring boards as shown in FIGS. 4, 5, 6 and 7.

Stating more specifically, a prior art embodiment shown in FIGS. 4 and 5 is arranged such that a groove-shaped accommodating portion 2 is defined by holding ribs 3 formed integrally with or separately from rear portion of an instrument board 1, and the protruding portion 4' of a flexible printed wiring board 4 is bent and inserted into the accommodating portion 2 thereby restraining the protruding portion 4' by the holding ribs 3 and preventing it from springing out.

Further, another prior art embodiment as shown in FIGS. 6 and 7 is arranged such that the protruding portion 4' of the flexible printed wiring board 4 is bent along side wall 1' of the instrument casing 1 so as to engage the protruding portion 4' with the side wall 1' thereby preventing the protrusion 4' from contacting other component part or parts.

However, in the case of the above-mentioned prior art embodiment shown in FIGS. 4 and 5, in case the length of the protruding portion of the flexible printed wiring board is long it can be fixedly secured and restrained, whilst in case the length of the protruding portion is short there is a risk of the protruding portion getting out of place simply from within the accommodating portion by the resiliency or the restoring force of the flexible printed wiring board.

Whilst, in the case of the above-mentioned prior art embodiment shown in FIGS. 6 and 7, in case there is an obstacle such as a built-in panel in the vicinity of an instrument casing, this securing mode cannot be used in practice, and also it is less reliable in fixedly securing the flexible printed wiring board.

The subject of the present invention is, therefore, to overcome the above-mentioned problem associated with the prior art mounting structure for flexible printed wiring boards.

SUMMARY OF THE INVENTION

The present invention has for its object to provide a mounting structure for a flexible printed wiring board wherein the portion of the printed wiring board protruding from the rear surface of a casing such as, for example, an instrument casing can be fixedly secured thereby preventing the protruding portion from getting out of place.

According to the present invention, there is provided a mounting structure for a flexible printed wiring board wherein the portion of the printed wiring board protruding from the rear surface of a casing such as, for example, an instrument casing is bent along the side wall of the wiring board and the bent portion is restrained and fixedly secured by a plurality of holding ribs formed on the side wall of the instrument casing, wherein auxiliary ribs with rounded leading ends are disposed in juxtaposition in such a manner that each of the auxiliary ribs is formed between the adjoining holding ribs so as to allow the auxiliary ribs to partially overlap the holding ribs one another in the direction of wall thickness thereof.

According to the mounting structure for a flexible printed wiring board, since the auxiliary ribs having a predetermined configuration are additionally provided in juxtaposition between the plurality of holding ribs, the protruding portion of the printed wiring board is held and fixedly secured between the holding ribs and the auxiliary ribs, so that even though the protruding portion is short the reliability of the mounting structure in fixedly securing the protruding portion of the printed wiring board can be improved.

The above and other objects, aspects and advantages of the present invention will become apparent to those skilled in the art by making reference to the following description and the accompanying drawings in which a preferred embodiment incorporating the principles of the present invention is shown for example only.

DESCRIPTION OF THE PREFERRED EMBODIMENTS

The embodiments of the mounting structure for a flexible wiring board will according to the present invention will be described in detail below with reference to the accompanying drawings.

Figure 1:
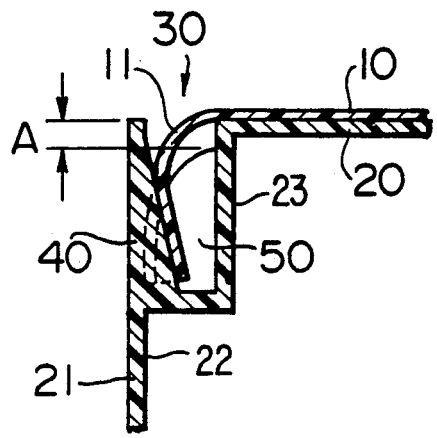
FIG. 1 is an explanatory sectional view of a mounting structure of a flexible printed wiring board according to the present invention taken along line 1—1 of FIG. 2.
Figure 2:
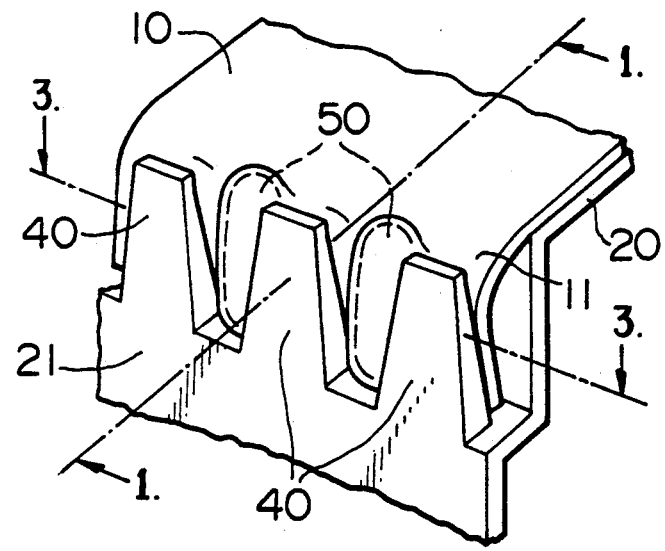
FIG. 2 is an explanatory perspective view of the mounting structure.

As shown in FIGS. 1 and 2, the mounting structure for a flexible printed wiring board according to the present invention comprises an accommodating portion 30 defined by a side wall 21 having a first portion 22 and a second portion 23 offset from the first portion 22. The side wall 21 is formed on the rear surface of a casing 20 such as, for example, an instrument casing of a motorcar. The present invention further comprises a plurality of holding ribs 40 provided in juxtaposition within the accommodating portion 30, and auxiliary ribs 50, each being formed in juxtaposition between the adjoining holding ribs 40. The holding ribs 40 extend from the first portion 22, and the row of auxiliary ribs 50 extend from the second portion 23.

The holding ribs 40 and the auxiliary ribs 50 are formed by molding them as integral unit of the side wall 21 of the casing 20 forming the accommodating portion 30, or by molding them separately from the side wall 21 and adhesively bonding them to the side wall. Both the holding ribs 40 and the auxiliary ribs 50 are formed in juxtaposition in such a way that their thicknesses increase gradually towards the bottom of the accommodating portion 30.

The auxiliary ribs 50 are lower in height than that of the holding ribs 40 by a dimension "A" and their leading ends are rounded so as to facilitate the insertion of the protruding portion 11 of the flexible printed wiring board 10 into the accommodating portion 30.

Figure 3:
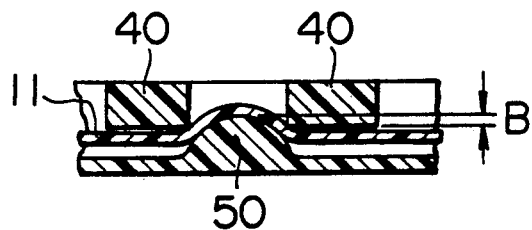
FIG. 3 is an explanatory sectional plan view of the same taken along line 3—3 of FIG. 2.
Figure 4:
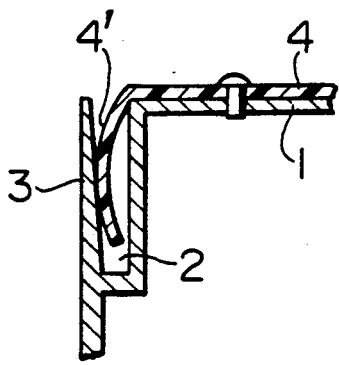
FIG. 4 is an explanatory sectional view of a prior art mounting structure for a flexible printed wiring board.
Figure 5:
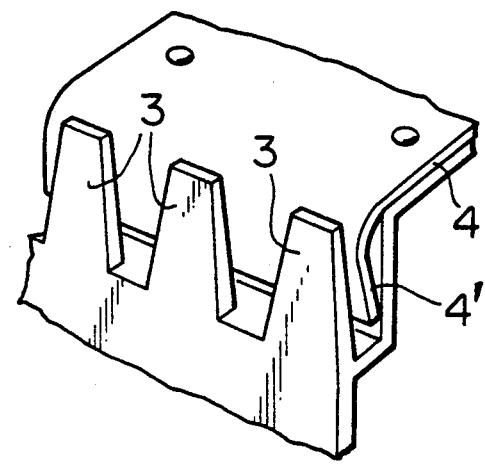
FIG. 5 is an explanatory perspective view of the same.
Figure 6:
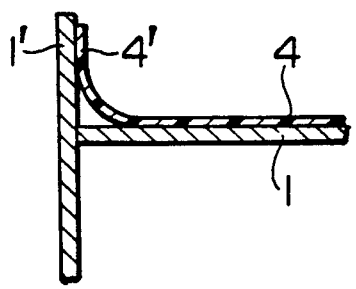
FIG. 6 is an explanatory sectional view of another prior art mounting structure for a flexible printed wiring board.
Figure 7:
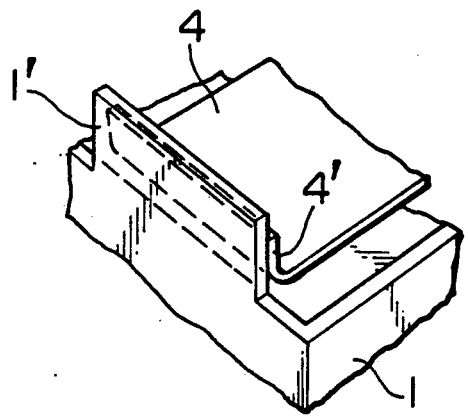
FIG. 7 is an explanatory perspective view of the same.

Further, as shown in FIG. 3, the holding ribs 40 and the auxiliary ribs 50 are arranged so as to overlap partially by a dimension B in the direction of wall thickness thereof, thereby capturing and holding securely the protruding portion 11 of the flexible printed wiring board 10 therebetween.

Thus, according to the mounting structure for a flexible printed wiring board according to the present invention, since the arrangement is made such that the portion 11 of the printed wiring board 10 protruding from the rear surface of the casing 20 is bent along the edge of the casing 20 and captured or held between the holding ribs 40 and the auxiliary ribs 50, even in case the length of the protruding portion 11 is short it can be fixedly secured so that such disadvantages as damage of other component part(s) by the protruding portion 11 and disconnection of the wirings of the printed wiring board 10 can be eliminated.

Furthermore, while the above-mentioned embodiments show the case where the holding ribs 40 and the auxiliary ribs 50 are provided inside the side wall of the instrument casing, the present invention is not to be limited to this embodiment, but also in case the ribs are formed partially in the recess of the side wall of the instrument casing, or in case where the ribs are disposed in the accommodating portion which projects to some degree from the outer surface of the side wall of the instrument casing, the same effect as that of the above-mentioned embodiment can be obtained.

As described hereinabove, according to the mounting structure for a flexible printed wiring board according to the present invention, since the auxiliary ribs having a predetermined configuration are additionally provided in juxtaposition between the plurality of holding ribs, the protruding portion of the flexible printed wiring board is captured and fixedly secured between the above-mentioned holding ribs and auxiliary ribs, so that even though the length of the protruding portion is short the reliability of the mounting structure in fixedly securing the protruding portion can be improved substantially.

It is to be understood that the foregoing description is merely illustrative of a preferred embodiment, and that the scope of the present invention is not to be limited thereto, but is to be determined by the scope of the appended claim.

What is claimed is:

1. A mounting structure, for a flexible printed wiring board, comprising receiving means for receiving a portion of a wiring board, said receiving means comprising a side wall further comprising a first portion and a second portion offset from said first portion, a row of spaced-apart holding ribs extending from said first portion and an opposing row of spaced-apart auxiliary ribs extending from said second portion;

wherein said auxiliary ribs each has a rounded side that increases with protrusion toward the root of the auxiliary rib and faces said holding ribs; and wherein said auxiliary ribs are positioned with respect to said holding ribs such that part of the rounded sides of the auxiliary ribs protrudes between adjacent holding ribs, whereby a portion of a flexible printed wiring board may be received between the row of holding ribs and the row of auxiliary ribs.

2. A mounting structure according to claim 1, wherein said holding ribs and said auxiliary ribs are integral with the side wall.

3. A mounting structure according to claim 1, wherein said holding ribs and said auxiliary ribs are bonded to the side wall.

* * * * *